United States Patent
Tomita

(10) Patent No.: US 8,080,857 B2
(45) Date of Patent: Dec. 20, 2011

(54) SEMICONDUCTOR PHOTODETECTING DEVICE AND ILLUMINANCE SENSOR

(75) Inventor: Noriko Tomita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 324 days.

(21) Appl. No.: 12/285,106

(22) Filed: Sep. 29, 2008

(65) Prior Publication Data

US 2009/0095888 A1  Apr. 16, 2009

(30) Foreign Application Priority Data

Oct. 16, 2007 (JP) ................. 2007-268958

(51) Int. Cl.
*H01L 31/103* (2006.01)

(52) U.S. Cl. ........ 257/461; 257/290; 257/292; 257/463; 257/E31.057

(58) Field of Classification Search .......... 257/290–300, 257/315–316, 461–465
See application file for complete search history.

(56) References Cited

U.S. PATENT DOCUMENTS

2006/0172482 A1* 8/2006 Komori et al. ............... 438/211

FOREIGN PATENT DOCUMENTS

JP  2006-245264  9/2006

* cited by examiner

*Primary Examiner* — Dung A. Le
(74) *Attorney, Agent, or Firm* — Rabin & Berdo, PC

(57) ABSTRACT

The present invention provides a semiconductor photodetecting device that suppresses sensitivity of a short wavelength component of irradiated light as well as a long wavelength component thereof and has a spectral sensitivity characteristic approximately coincident with a human visibility characteristic, and an illuminance sensor including the semiconductor photodetecting device. The semiconductor photodetecting device has a P-type well region and an N-type well region provided side by side along the surface of a P-type semiconductor substrate, a high-concentration N-type region formed in the neighborhood of the surface of the P-type well region, and a high-concentration P-type region formed in the neighborhood of the surface of the N-type well region. A first photoelectric current which flows through a PN junction formed by the P-type well region and the high-concentration N-type region, and a second photoelectric current obtained by adding a photoelectric current which flows through a PN junction formed by the N-type well region and the P-type semiconductor substrate to a photoelectric current which flows through a PN junction formed by the N-type well region and the high-concentration P-type region are extracted. Predetermined arithmetic processing is performed on the first and second photoelectric currents to obtain an output current.

19 Claims, 5 Drawing Sheets

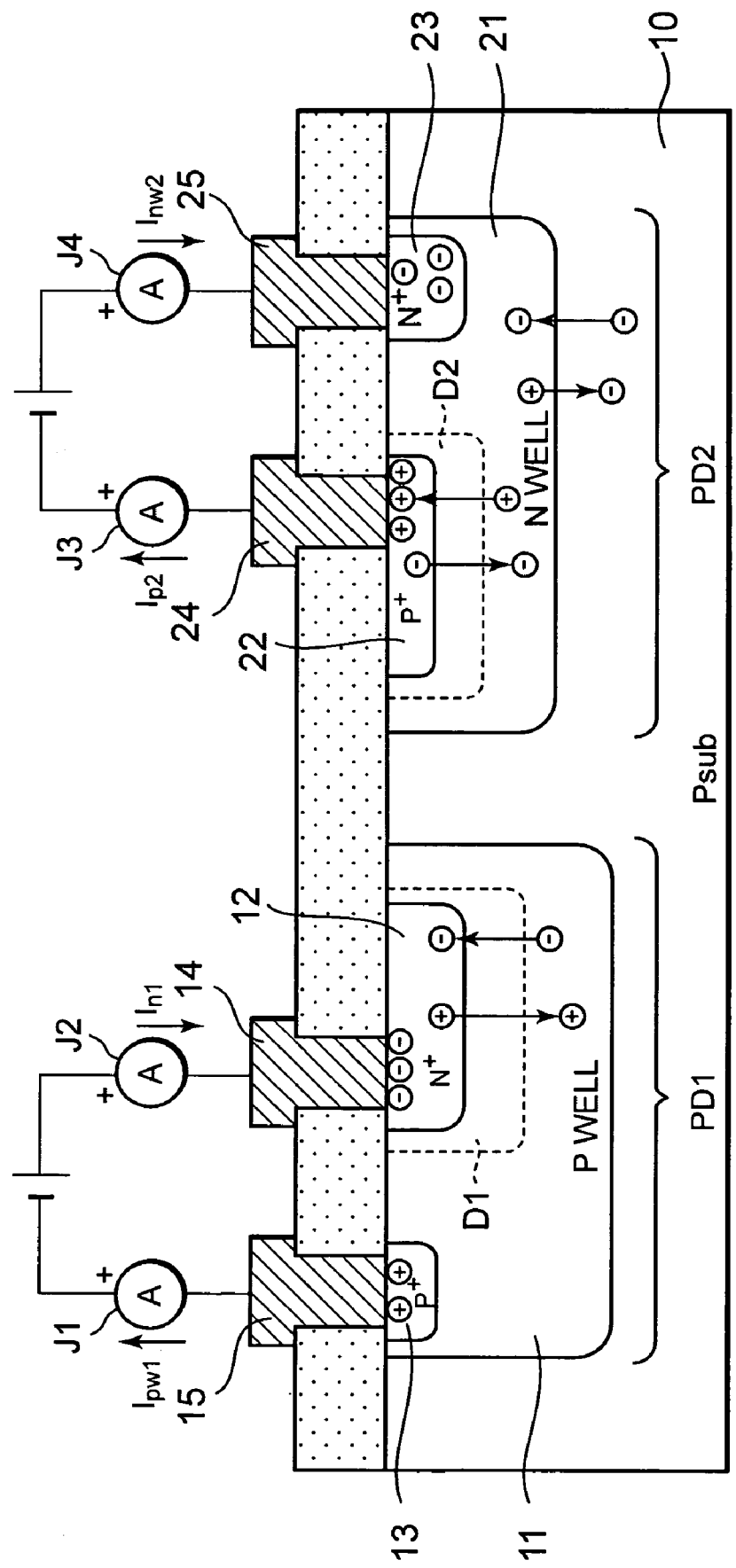

SEMICONDUCTOR PHOTODETECTING DEVICE AND ILLUMINANCE SENSOR

BACKGROUND OF THE INVENTION

The present invention relates to a semiconductor photodetecting device and an illuminance sensor used in visibility illuminance measurement or the like.

There has recently been a growing demand for an illuminance sensor having a spectral sensitivity characteristic close to a human visibility characteristic. Such an illuminance sensor can be used for controlling that when the amount of light applied to the illuminance sensor is large as in daylight and in the case of a bright room with the illuminance sensor being mounted to a cellular phone, for example, the backlight of a keypad is turned off and the backlight of a liquid crystal panel is raised to the maximum brightness, whereas when the amount of light applied to the illuminance sensor is small as in the open air at night, the backlight of the keypad is turned on and the backlight of the liquid crystal panel is diminished or reduced. Controlling the turning on of the backlight and its brightness according to the ambient brightness using the illuminance sensor in this way makes it possible to reduce the drain on a battery and make continuous talk time and standby time longer.

The peak value of a spectral sensitivity or response characteristic of such an illuminance sensor is appreciably approaching 555 nm corresponding to the peak value of human visibility such as on the order of about 550 nm to 600 nm. There is however a case in which a defective condition occurs in that output currents differ even under the same illuminance where a source of light is a fluorescent light and sunlight, for example. This is ascribable to the fact that a difference occurs between emission spectra depending on the source of light, and the illuminance sensor has sensitivity even with respect to infrared light and ultraviolet light imperceptible to the human eye. That is, in order to allow the sensitivity of the illuminance sensor to coincide with the human visibility characteristic, there is a need to match spectral sensitivity characteristics on the long-wavelength and short-wavelength sides as viewed from the peak value with the human visibility as well as the matching of peak wavelengths of spectral sensitivity characteristics.

In order to solve such a problem, a patent document 1 (Japanese Unexamined Patent Publication No. 2006-245264) (FIG. 5) has shown an example of a photosensor or photodetecting device which eliminates an influence on the output current based on the infrared light and has a spectral sensitivity characteristic corresponding to visibility. Described specifically, the patent document 1 has described that two p-type regions 34 and 35 are respectively formed in an n-type semiconductor layer 2 at depths of 1.5 µm and 3 µm thereby to form two diodes D4 and D5, the output of the diode D5 is set to 1.05 times by an arithmetic circuit and the resultant value is subtracted from the output of the diode D4 thereby to enable the sensitivity of an infrared region to be approximately zero, thus making it possible to realize the spectral sensitivity characteristic corresponding to the visibility.

It has been described in the patent document 1 that the outputs of the two diodes different in spectral sensitivity are subjected to arithmetic processing in the photodetecting device described in the patent document 1 thereby to set the sensitivity of the infrared region to approximately zero. A graph indicating the dependence of each output current on the wavelength is shown in FIG. 6 of the same patent document. According to the graph, the sensitivity still exists on the short-wavelength side although an improvement effect appears in the infrared region. It is hard to say that this is one corresponding to the human visibility characteristic. There is thus room for its improvement.

SUMMARY OF THE INVENTION

The present invention has been made in view of the foregoing points. It is an object of the present invention to provide a semiconductor photodetecting device that suppresses sensitivity of a short wavelength component of irradiated light as well as a long wavelength component thereof and has a spectral sensitivity characteristic approximately coincident with a human visibility characteristic, and an illuminance sensor including the semiconductor photodetecting device.

According to one aspect of the present invention, for attaining the above object, there is provided a semiconductor photodetecting device formed within a P-type semiconductor substrate, comprising a P-type well region and an N-type well region provided side by side along the surface of the P-type semiconductor substrate, a high-concentration N-type region formed in the neighborhood of the surface of the P-type well region, and a high-concentration P-type region formed in the neighborhood of the surface of the N-type well region.

According to another aspect of the present invention, for attaining the above object, there is provided an illuminance sensor including the semiconductor photodetecting device, comprising an arithmetic circuit for extracting a first photoelectric current which flows through a PN junction formed by the P-type well region and the high-concentration N-type region and a second photoelectric current obtained by adding a photoelectric current which flows through a PN junction formed by the N-type well region and the P-type semiconductor substrate to a photoelectric current which flows through a PN junction formed by the N-type well region and the high-concentration P-type region, and providing a current obtained by performing predetermined arithmetic processing on the first and second photoelectric currents, as a detected output.

According to the semiconductor photodetecting device and the illuminance sensor of the present invention, a spectral sensitivity characteristic approximately coincident with a human visibility characteristic can be realized.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 4 is a sectional view illustrating the operation of the semiconductor photodetecting device showing the embodiment of the present invention;

DETAILED DESCRIPTION OF THE PREFERRED EMBODIMENTS

Figure 1:
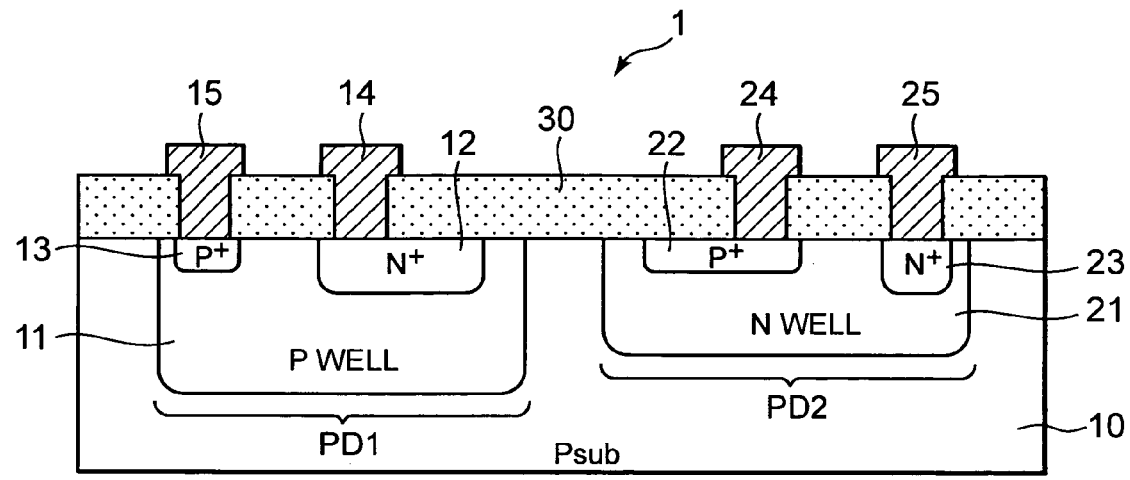
FIG. 1 is a sectional structure view of a semiconductor photodetecting device showing an embodiment of the present invention.

Preferred embodiments of the present invention will hereinafter be described with reference to the accompanying drawings. Incidentally, the same reference numerals are respectively attached to constituent elements and portions substantially identical or equivalent in the drawings shown below.

FIG. 1 is a sectional structure view of a semiconductor photodetecting device 1 showing an embodiment of the present invention. The semiconductor photodetecting device 1 comprises two photodiodes PD1 and PD2 formed within a P-type semiconductor substrate 10 so as to be placed side by side along its surface.

The photodiode PD1 comprises a P-type well region 11 formed within the P-type semiconductor substrate 10, and high-concentration N-type and P-type regions 12 and 13 formed so as to be placed side by side in the neighborhood of a surface lying within the P-type well region 11. A first PN junction formed by the P-type well region 11 and the N-type region 12 is provided at a depth of 0.7 μm or so as viewed from the surface of the semiconductor photodetecting device 1. An impurity concentration of the P-type well region 11 is higher by one digit or more than that of the P-type semiconductor substrate 10. When the impurity concentration of the P-type semiconductor substrate 10 is $1E15\ cm^{-3}$, for example, the impurity concentration of the P-type well region is preferably $1E16\ cm^{-3}$ or more. It is desirable that the impurity concentrations of the N-type region 12 and the P-type region 13 are $1E20\ cm^{-3}$ or more. A light transmissive or penetrative insulating film 30 comprised of, for example, SiN or the like is provided on the surface of the P-type semiconductor substrate 10. Aluminum electrodes 14 and 15 are respectively formed above the N-type region 12 and the P-type region 13 via openings defined in the insulating film 30 in electrically-connected states. The P-type region 13 is provided to cause the aluminum electrode 15 and the P-type well region 11 to ohmic-contact with each other.

On the other hand, the photodiode PD2 comprises an N-type well region 21 formed so as to be placed side by side with the P-type well region within the P-type semiconductor substrate 10, and high-concentration P-type and N-type regions 22 and 23 respectively formed so as to be placed side by side in the neighborhood of a surface lying within the N-type well region 21. Namely, the photodiode PD2 has a second PN junction formed by the N-type well region 21 and the P-type region 10, and a third PN junction formed by the P-type semiconductor substrate 10 and the N-type well region 21. The second PN junction is provided at a position shallower than the first PN junction formed by the P-type well region 11 and the N-type region 12 of the photodiode PD1, for example, at a depth of 0.4 μm or so as viewed from the substrate surface. It is desirable that the impurity concentration of the N-type well region 21 is $1E17\ cm^{-3}$ or so, for example and the impurity concentrations of the P-type region 22 and the N-type region 23 are $1E20\ cm^{-3}$ or more. Aluminum electrodes 24 and 25 are respectively formed above the P-type region 22 and the N-type region 23 via the openings defined in the insulating film 30 in electrically-connected states. The N-type region 23 is formed to cause the aluminum electrode 25 and the N-type well region 21 to ohmic-contact with each other.

Figure 2:
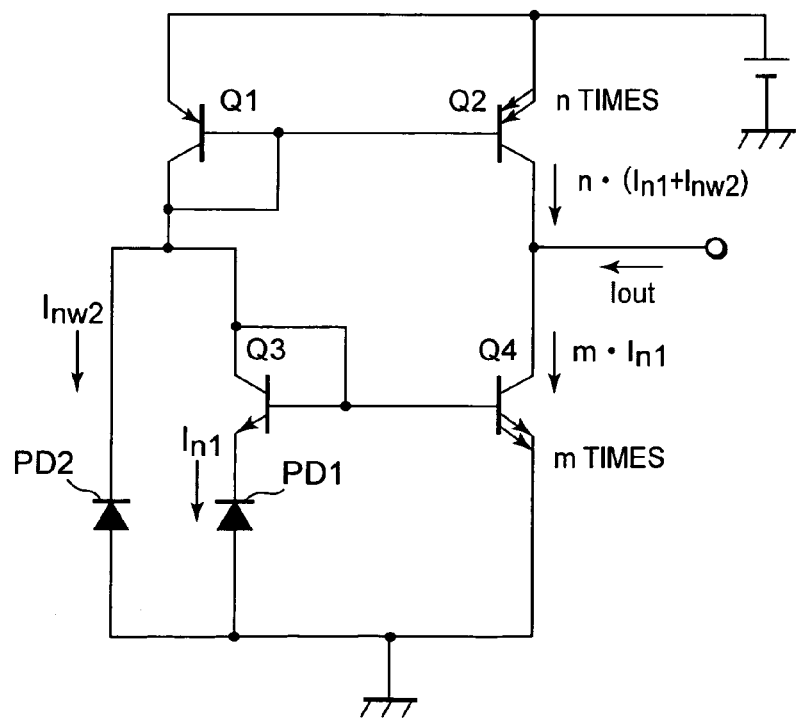
FIG. 2 is an equivalent circuit diagram of an arithmetic circuit illustrating the embodiment of the present invention.

Incidentally, unillustrated diffusion regions and the like are provided within the P-type semiconductor substrate 10. An arithmetic circuit for performing predetermined arithmetic processing on photoelectric currents developed by the photodiodes PD1 and PD2 by light irradiation is formed in such a circuit configuration as shown in FIG. 2, for example.

A method for manufacturing the semiconductor photodetecting device 1 having the above structure will be explained below with reference to views illustrating a process for manufacturing the same, which are shown in FIGS. 3(a) through 3(g). A P-type semiconductor substrate 10 is first prepared. In the present embodiment, a general one whose impurity concentration is $1E15\ cm^{-3}$ or so is used (FIG. 3(a)).

Figure 3A:
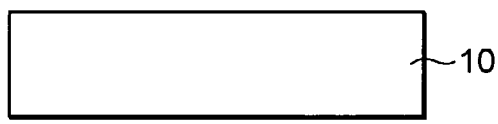
FIGS. 3(a) through 3(g) are respectively sectional views showing a process for manufacturing the semiconductor photodetecting device showing the embodiment of the present invention.
Figure 3B:
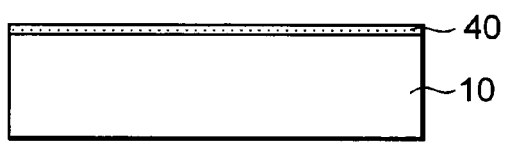
Figure 3C:
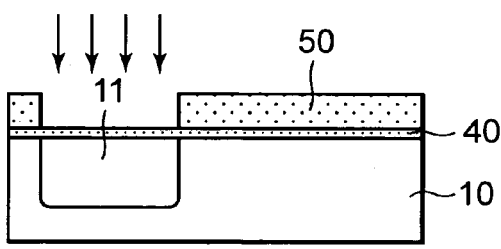
Figure 3D:
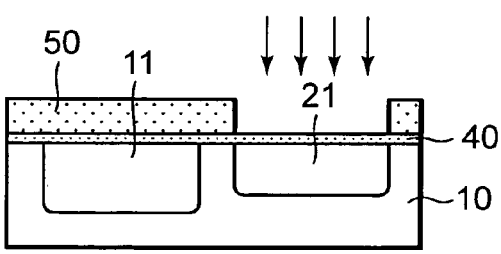
Figure 3E:
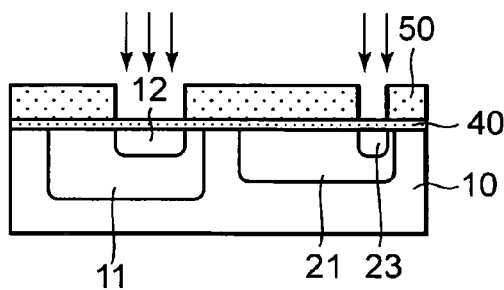
Figure 3F:
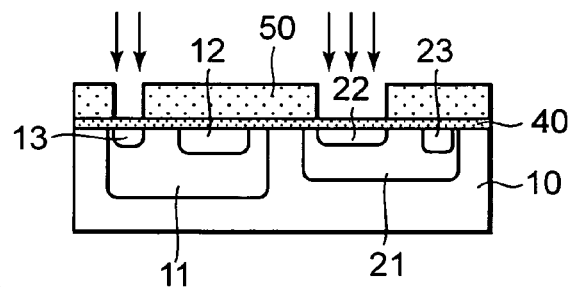
Figure 3G:
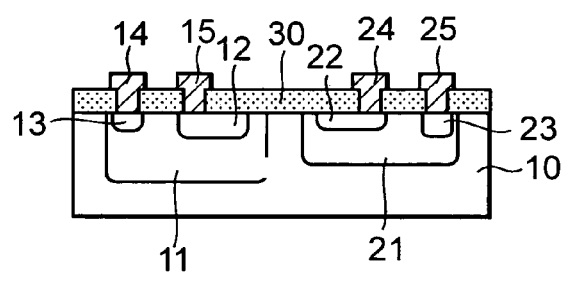

An insulating film 40 having a thickness of 100□ or so, which is comprised of $SiO_2$ or the like, is formed on the surface of the P-type semiconductor substrate 10 subjected to a thermal oxidation process (FIG. 3(b)). The insulating film 40 is introduced for the purpose of relaxing damage to the substrate surface at its subsequent ion implanting step.

Next, a photoresist 50 is applied onto the P-type semiconductor substrate 10 formed with the insulating film 40. Thereafter, a portion corresponding to the position where a P-type well region 11 is formed is etched to form a resist opening. Next, a P-type impurity such as 11B, 49BF or the like is ion-implanted to form the corresponding P-type well region 11 (FIG. 3(c)). This ion implanting step is performed twice with the same P-type impurity while its implantation energy is being changed. That is, the first ion implantation is executed to form an energy barrier between the P-type semiconductor substrate 10 and the P-type well region 11. The ion implantation is performed in such a manner that the implantation energy is set to 1400 through 1500 KeV and the concentration peak of the impurity based on the corresponding ion implantation is distributed in the vicinity of 2.2 through 2.4 μm as viewed from the substrate surface. While the P-type well region 11 and the P-type semiconductor substrate 10 are of the junction of the same conductivity type, the energy barrier is formed between the P-type semiconductor substrate 10 and the P-type well region 11 thereby to suppress the flow of carriers based on a long wavelength component of incident light developed on the side low in impurity concentration (substrate side) into the side high in impurity concentration (P-type well region side). Namely, the photodiode PD1 has a structure resistant to each photoelectric current based on carriers developed within the P-type semiconductor substrate 10 by the long wavelength component of the incident light. On the other hand, the second ion implantation is performed to position the first PN junction configured by the P-type well region 11 and the N-type region 12 as described above in the neighborhood of 0.7 μm and set the width of a depletion layer D1 formed in the vicinity of the first PN junction to 0.9 through 1.0 μm. The ion implantation is performed in such a manner that the implantation energy is set to 1000 through 1100 KeV and the concentration peak of the impurity based on the corresponding ion implantation is distributed in the vicinity of 1.8 through 2.0 μm as viewed from the substrate surface. It is desirable that the impurity concentration of the P-type well region 11 formed by the second ion implantation is set to 1E16 cm$^{-3}$ or more higher by one digit or more than that of the P-type semiconductor substrate 10.

Next, a new photoresist 50 is applied onto the P-type semiconductor substrate 10. Thereafter, a portion corresponding to the position where an N-type well region 21 is formed is etched to form a resist opening. Next, an N-type impurity such as 31P or the like is ion-implanted to form the corresponding N-type well region 21 (FIG. 3(d) In this ion implanting step, the implantation energy is set to, for example, 500 KeV to perform ion implantation, and the impurity concentration of the N-type well region 21 is assumed to be 1E17 cm$^{-3}$. The N-type well region 21 is formed shallower than the P-type well region 11.

Next, a new photoresist 50 is applied onto the P-type semiconductor substrate 10. Thereafter, portions corresponding to the positions where N-type regions 12 and 23 are formed are etched to form resist openings. Next, an N-type impurity such as 31P or the like is ion-implanted to form the corresponding high-concentration N-type regions 12 and 23 (FIG. 3(e)). In this ion implanting step, the implantation energy is set to, for example, 60 KeV to perform ion implantation. A first PN junction is formed in a depth position of 0.7 μm or so as viewed from the substrate surface, and the impurity concentrations of the N-type regions 12 and 23 are assumed to be 1E20 cm$^{-3}$ or more.

Next, a new photoresist 50 is applied onto the P-type semiconductor substrate 10. Thereafter, portions corresponding to the positions where P-type regions 13 and 22 are formed are etched to form resist openings. Next, a P-type impurity such as 11B, 49BF2 or the like is ion-implanted to form the corresponding high-concentration P-type regions 13 and 22 (FIG. 3(f)). In this ion implanting step, the implantation energy is set to, for example, 4.0 KeV to perform ion implantation. A second PN junction is formed in a depth position of 0.4 μm or so as viewed from the substrate surface, and the impurity concentrations of the P-type regions 13 and 22 are assumed to be 1E20 cm$^{-3}$ or more. Next, the insulating film 40 formed on the P-type semiconductor substrate 10 is eliminated. Thereafter, an insulting film 30 having light transparency, which is comprised of SiN or the like and has a thickness of 8000☐ or so, is formed on the substrate by a CVD method or the like. After its formation, contact openings are respectively formed above the N-type regions 12 and 23 and the P-type regions 13 and 22. Thereafter, an Al film is formed by a sputtering method and Al electrodes are formed by a photolitho and etching process (FIG. 3(g)). The semiconductor photodetecting device 1 of the present invention is completed via the above-described process steps.

Figure 5A:
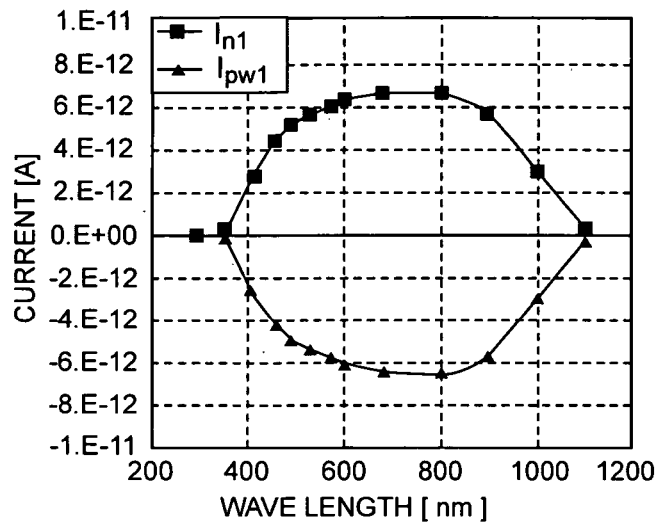
FIGS. 5(a) and 5(b) are respectively graphs showing the dependence of photoelectric currents generated by the semiconductor photodetecting device showing the embodiment of the present invention on the wavelengths.
Figure 5B:
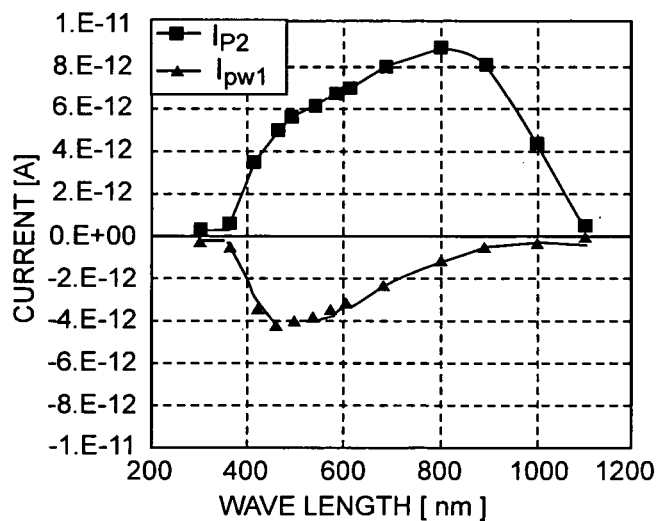
Figure 5C:
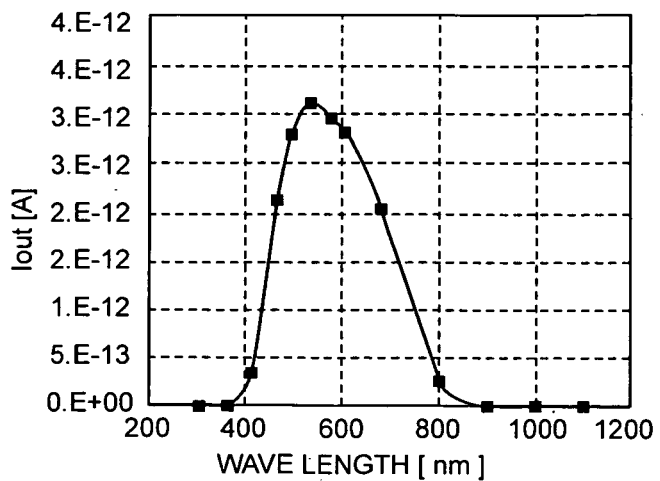
FIG. 5(c) is a graph showing the dependence of an output current obtained by arithmetic processing of a photoelectric current generated by the semiconductor photodetecting device showing the embodiment of the present invention on the wavelength.

The operation of the semiconductor photodetecting device 1 of the present invention will next be explained with reference to a sectional view shown in FIG. 4 and measured data shown-in FIGS. 5(a) through 5(c). When illuminance measurement is done using the semiconductor photodetecting device 1 of the present invention, the photodiodes PD1 and PD2 are reverse-biased at 1V or so. When the photodiode PD1 is reverse-biased, a positive-side terminal of a bias power supply is connected to the electrode 14 and a negative-side terminal thereof is connected to the electrode 15 as shown in FIG. 4. When the photodiode PD2 is reverse-biased, a positive-side terminal of a bias power supply is connected to the electrode 25 and a negative-side terminal thereof is connected to the electrode 24. With this reverse bias voltage, a depletion layer D1 is formed in the neighborhood of the first PN junction formed by the P-type well region 11 and N-type region 12 of the photodiode PD1, and a depletion layer D2 is formed in the neighborhood of the second PN junction formed by the N-type well region 21 and P-type region 22 of the photodiode PD2. When light containing a wavelength component ranging from 300 nm to 1100 nm is applied to the semiconductor photodetecting device 1 in this state, electron-hole pairs are generated in the respective regions of the semiconductor photodetecting device 1. With the action of electric fields developed inside the depletion layers D1 and D2, electrons are accelerated toward the N-type region 12 and/or N-type well region 21 in the depletion layers, and positive holes are accelerated toward the P-type well region 11 and/or P-type region 22 therein.

In the photodiode PD1, the positive holes of the electron-hole pairs generated within the P-type region 13 and the P-type well region 11 are stored in the P-type region 13 together with the positive holes that have flowed from the N-type region 12 via the depletion layer. D1. On the other hand, the electrons of the electron-hole pairs generated within the N-type region 12 are stored in the N-type region 12 together with the electrons that have flowed from the P-type well region 11 via the depletion layer D1. FIG. 5(a) is a graph showing the dependence of photoelectric currents generated by the photodiode PD1 on the wavelength. Here, the photoelectric current $I_{n1}$ indicates current measured by an ammeter J2 inserted between the positive-side terminal of the bias power supply and the electrode 14 and indicates a photoelectric current developed by pulling out the electrons stored in the N-type region 12. On the other hand, the photoelectric current $I_{pw1}$ indicates current measured by an ammeter J1 inserted between the negative-side terminal of the bias power supply and the electrode 15 and indicates a photoelectric current generated by pulling out the positive holes stored in the P-type region 13. Incidentally, the direction in which the current flows into the semiconductor photodetecting device 1 is represented as positive in FIG. 5(a). The photoelectric currents $I_{n1}$ and $I_{pw1}$ respectively indicate similar wavelength dependence and assume values approximately uniform in a wavelength region that ranges from 500 nm to 900 nm. That is, the photodiode PD1 has a spectral sensitivity characteristic approximately uniform in the wavelength region. Such a characteristic is obtained from the result that the forming position of the PN junction is set to 0.7 μm or so as viewed from the substrate surface, the impurity concentrations of the respective regions are controlled in such a manner that the width of the depletion layer D1 ranges from 0.9 μm to 1.0 μm, and the energy barrier is formed between the P-type semiconductor substrate 10 and the P-type well region 11 to suppress the flow of carriers produced within the P-type semiconductor substrate 10 due to the long wavelength component of the incident light. Of the two photoelectric currents developed at the photodiode PD1, $I_{n1}$ is targeted for arithmetic processing by the arithmetic circuit.

In the photodiode PD2, the positive holes of the electron-hole pairs generated within the P-type region 22 are stored in the P-type region 22 along with the positive holes that have flowed from the N-type well region 21 via the depletion layer D2. On the other hand, the electrons of the electron-hole pairs generated within the N-type region 23 and the N-type well region 21 are stored in the N-type region 23 together with the electrons that have flowed from the P-type region 22 and the P-type semiconductor substrate 10. FIG. 5(b) is a graph showing the dependence of photoelectric currents generated by the photodiode PD2 on the wavelength. Here, the photoelectric current $I_{p2}$ indicates current measured by an ammeter J3 inserted between the negative-side terminal of the bias power supply and the electrode 24 and indicates a photoelectric current developed by pulling out the electrons stored in the P-type region 22. The photoelectric current $I_{p2}$ has a peak in a short wavelength region in the neighborhood of 450 nm. This is because the depth of the second PN junction formed by the P-type region 22 and the N-type well region 21 is formed in a relatively shallow position. On the other hand, the photoelectric-current $I_{nw2}$ indicates current measured by an ammeter J4 inserted between the positive-side terminal of the bias power supply and the electrode 25 and indicates a photoelectric current generated by pulling out the electrons stored in the N-type region 23. Namely, the photoelectric current $I_{nw2}$ results in one obtained by adding a photoelectric current based on electrons supplied via the second PN junction formed in the relatively shallow position by the P-type region 22 and the N-type well region 21 and a photoelectric current based on electrons supplied via the third PN junction formed in a relatively deep position by the N-type well region 21 and the P-type semiconductor substrate 10. The photoelectric current based on the electrons supplied via the second PN junction indicates wavelength dependence similar to the photoelectric current $I_{p2}$ and has a peak in the neighborhood of 450 nm. On the other hand, the photoelectric current based on the electrons supplied via the third PN junction has a peak in a long wavelength region equivalent to infrared light. Thus, the photoelectric current $I_{nw2}$ obtained by adding these currents together has sensitivity in a wide range extending from the short wavelength region to the long wavelength region as shown in FIG. 5(b) and particularly has a peak in a wavelength region equivalent to the infrared light. Of the two photoelectric currents developed at the photodiode PD2, $I_{nw2}$ is targeted for arithmetic processing by the arithmetic circuit.

The photoelectric current $I_{n1}$ taken out by the photodiode PD1 and the photoelectric current $I_{nw2}$ taken out by the photodiode PD2 are subjected to arithmetic processing based on $Iout=K_1(I_{n1}-K_2 \cdot I_{nw2})$ by the arithmetic circuit having such a circuit configuration as shown in FIG. 2 and are taken out or extracted as an output current Iout. The dependence of the output current Iout obtained by such arithmetic processing on the wavelength is shown in FIG. 5(c). As shown in the same drawing, the output current Iout has the peak of sensitivity in the vicinity of 555 nm corresponding to the peak value of human visibility and has little sensitivity in a short wavelength region of 400 nm or less and a long wavelength region of 800 nm imperceptible to the human eye. That is, predetermined arithmetic processing is performed on the photoelectric currents generated by the semiconductor photodetecting device of the present invention comprising the two photodiodes thereby to make it possible to configure an illuminance sensor having a spectral sensitivity characteristic that approximately coincides with the human visibility.

Figure 6:
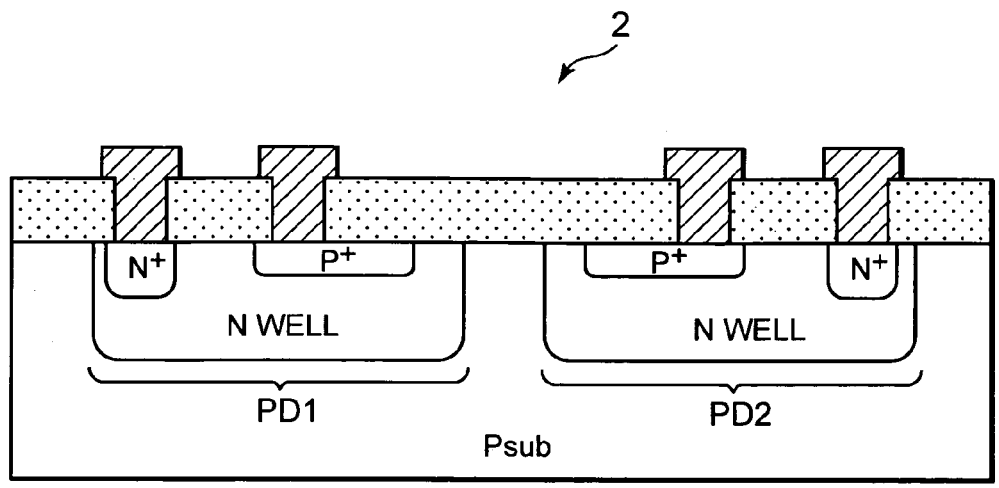
FIG. 6 is a sectional structure view of a semiconductor photodetecting device manufactured to perform a characteristic comparison with the semiconductor photodetecting device illustrative of the embodiment of the present invention.
Figure 7:
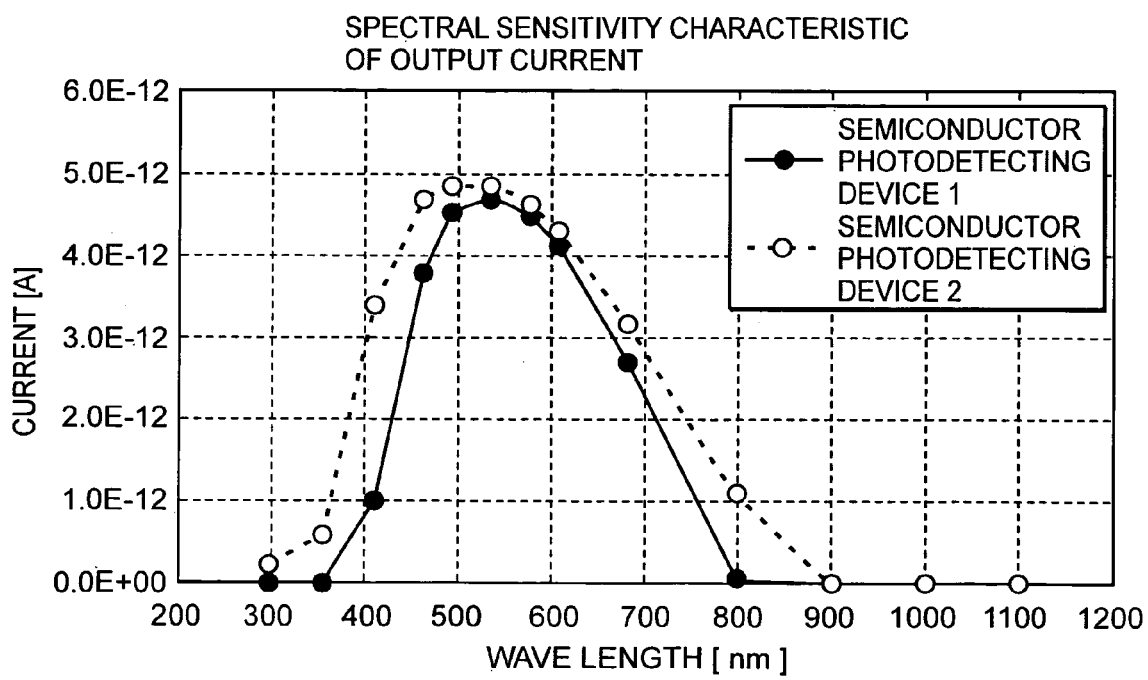
FIG. 7 is a graph obtained by comparing the dependence of output currents on the wavelengths.

FIG. 6 is a sectional view showing a structure of a semiconductor photodetecting device 2 manufactured to perform a characteristic comparison with the spectral sensitivity characteristic of the semiconductor photodetecting device 1 of the present invention. The semiconductor photodetecting device 2 comprises two photodiodes PD1 and PD2 in a manner similar to the semiconductor photodetecting device 1 of the present invention. The semiconductor photodetecting device 2 is different from the semiconductor photodetecting device 1 of the present invention in the structure of the photodiode PD1. The photodiode PD2 has the same structure as the semiconductor photodetecting device 1 of the present invention. The photodiode PD1 of the semiconductor photodetecting device 2 is identical to the photodiode PD2 in structure and configured in such a manner that an N-type region and a P-type region are formed within a P-type well region. Namely, the semiconductor photodetecting device 2 has a configuration in which the photodiodes identical in structure are provided side by side. FIG. 7 is a graph obtained by comparing both the wavelength dependence of an output current Iout obtained by performing the above-described arithmetic processing on a photoelectric current generated by the semiconductor photodetecting device 2 having such a structure and the wavelength dependence of an output current Iout where the semiconductor photodetecting device 1 of the present invention is used. It can be said that since the output current is suppressed in both of a short wavelength region of 400 nm or less and a long wavelength region of 800 nm or more as shown in the same drawing, the semiconductor photodetecting device 1 according to the present invention has a spectral sensitivity characteristic closer to a human visibility characteristic. That is, it can be said that the semiconductor photodetecting device 1 is of a structure suitable for obtaining the spectral sensitivity characteristic coincident with the human visibility characteristic.

While the preferred forms of the present invention have been described, it is to be understood that modifications will be apparent to those skilled in the art without departing from the spirit of the invention. The scope of the invention is to be determined solely by the following claims.

DRAWINGS

FIG. 1
P WELL N WELL
FIG. 2
n TIMES
m TIMES
FIG. 4
P WELL N WELL
FIG. 6
N WELL N WELL
FIG. 7
SPECTRAL SENSITIVITY CHARACTERISTIC OF OUTPUT CURRENT
  SEMICONDUCTOR PHOTODETECTING DEVICE 1
  SEMICONDUCTOR PHOTODETECTING DEVICE 2

What is claimed is:

1. An illuminance sensor, comprising:
  a semiconductor photodetecting device formed within a P-type semiconductor substrate, the semiconductor photodetecting device including:
    a P-type well region and an N-type well region provided side by side along a surface of the P-type semiconductor substrate;
    a high-concentration N-type region formed in the neighborhood of a surface of the P-type well region; and
    a high-concentration P-type region formed in the neighborhood of a surface of the N-type well region; and
  an arithmetic circuit for extracting a first photoelectric current which flows through a PN junction formed by the P-type well region and the high-concentration N-type region and a second photoelectric current obtained by adding a photoelectric current which flows through a PN junction formed by the N-type well region and the P-type semiconductor substrate to a photoelectric current which flows through a PN junction formed by the N-type well region and the high-concentration P-type region, and providing a current obtained by performing predetermined arithmetic processing on the first and second photoelectric currents, as a detected output.

2. The illuminance sensor according to claim 1, further comprising:
  a light transmissive insulating film provided in the surface of the P-type semiconductor substrate, and a plurality of metal electrodes respectively connected to the P-type well region, the N-type well region, the high-concentration N-type region and the high-concentration P-type region through the insulating film.

3. The illuminance sensor according to claim 2, wherein an impurity concentration of the P-type well region is higher than an impurity concentration of the P-type semiconductor substrate.

4. The illuminance sensor according to claim 3, wherein the P-type well region is formed by two ion-implantations different in implantation energy from each other.

5. The illuminance sensor according to claim 2, wherein the P-type well region is formed by two ion-implantations different in implantation energy from each other.

6. The illuminance sensor according to claim 1, wherein a PN junction formed by the N-type well region and the high-concentration P-type region is formed in a position as viewed from the surface of the P-type semiconductor substrate, shallower than a PN junction formed by the P-type well region and the high-concentration N-type region.

7. The illuminance sensor according to claim 6, wherein an impurity concentration of the P-type well region is higher than an impurity concentration of the P-type semiconductor substrate.

8. The illuminance sensor according to claim 7, wherein the P-type well region is formed by two ion-implantations different in implantation energy from each other.

9. The illuminance sensor according to claim 6, wherein the P-type well region is formed by two ion-implantations different in implantation energy from each other.

10. The illuminance sensor according to claim 1, wherein an impurity concentration of the P-type well region is higher than an impurity concentration of the P-type semiconductor substrate.

11. The illuminance sensor according to claim 10, wherein the P-type well region is formed by two ion-implantations different in implantation energy from each other.

12. The illuminance sensor according to claim 1, wherein the P-type well region is formed by two ion-implantations different in implantation energy from each other.

13. The illuminance sensor according to claim 1, wherein a PN junction formed by the N-type well region and the high-concentration P-type region is formed in a position as viewed from the surface of the P-type semiconductor substrate, shallower than a PN junction formed by the P-type well region and the high-concentration N-type region.

14. The illuminance sensor according to claim 13, wherein an impurity concentration of the P-type well region is higher than an impurity concentration of the P-type semiconductor substrate.

15. The illuminance sensor according to claim 14, wherein the P-type well region is formed by two ion-implantations different in implantation energy from each other.

16. The illuminance sensor according to claim 13, wherein the P-type well region is formed by two ion-implantations different in implantation energy from each other.

17. The illuminance sensor according to claim 1, wherein an impurity concentration of the P-type well region is higher than an impurity concentration of the P-type semiconductor substrate.

18. The illuminance sensor according to claim 1, wherein the P-type well region is formed by two ion-implantations different in implantation energy from each other.

19. The illuminance sensor according to claim 1, wherein the P-type well region is formed by two ion-implantations different in implantation energy from each other.

* * * * *